US010298891B2

(12) United States Patent
Tabata

(10) Patent No.: US 10,298,891 B2
(45) Date of Patent: May 21, 2019

(54) IMAGE DRAWING APPARATUS, IMAGE DRAWING METHOD, AND NON-TRANSITORY COMPUTER READABLE MEDIUM STORING PROGRAM

(71) Applicant: JVC KENWOOD Corporation, Yokohama-shi, Kanagawa (JP)

(72) Inventor: Kiyofumi Tabata, Yokohama (JP)

(73) Assignee: JVC KENWOOD CORPORATION, Kanagawa (JP)

( * ) Notice: Subject to any disclaimer, the term of this patent is extended or adjusted under 35 U.S.C. 154(b) by 2 days.

(21) Appl. No.: 15/663,543

(22) Filed: Jul. 28, 2017

(65) Prior Publication Data

US 2017/0332059 A1 Nov. 16, 2017

Related U.S. Application Data

(63) Continuation of application No. PCT/JP2015/006275, filed on Dec. 16, 2015.

(30) Foreign Application Priority Data

Jan. 30, 2015 (JP) ................................ 2015-017339

(51) Int. Cl.
*H04N 9/31* (2006.01)
*G09G 3/02* (2006.01)
(Continued)

(52) U.S. Cl.
CPC ......... *H04N 9/3155* (2013.01); *G02B 26/101* (2013.01); *G09G 3/02* (2013.01);
(Continued)

(58) Field of Classification Search
None
See application file for complete search history.

(56) References Cited

U.S. PATENT DOCUMENTS

2002/0005887 A1* 1/2002 Nakase .................... B41J 2/471
347/134
2014/0063172 A1* 3/2014 Oi ........................ G02B 26/122
347/224

(Continued)

FOREIGN PATENT DOCUMENTS

JP H03109586 A 5/1991
JP 2003-005110 A 1/2003
(Continued)

*Primary Examiner* — Samira Monshi
(74) *Attorney, Agent, or Firm* — Procopio, Cory, Hargreaves & Savitch LLP

(57) ABSTRACT

An image drawing apparatus includes a light source unit that outputs a laser light, a sensor that measures an index regarding brightness of the laser light, a scanner that reflects and scans the laser light, and an image processor that controls the light source unit, outputs the laser light to a drawing area narrower than a scanning area of the scanner so that an image based on image data that has been input is drawn, outputting an adjustment laser light to adjust the brightness of the laser light to an outside of the drawing area, stops the output of the adjustment laser light when a period (e.g., variable) until the time the output of the adjustment laser light becomes stable is passed after the output of the adjustment laser light is started, and adjusts the laser light brightness based on the index regarding the adjustment laser light brightness.

4 Claims, 7 Drawing Sheets

(51) Int. Cl.
*H04N 5/63* (2006.01)
*G02B 26/10* (2006.01)
*H01S 5/0683* (2006.01)
*H01S 5/06* (2006.01)
*H01S 5/40* (2006.01)

(52) U.S. Cl.
CPC ........... *H01S 5/06835* (2013.01); *H04N 5/63* (2013.01); *H04N 9/3129* (2013.01); *H04N 9/3161* (2013.01); *H04N 9/3164* (2013.01); *H04N 9/3194* (2013.01); *H01S 5/0617* (2013.01); *H01S 5/4093* (2013.01)

(56) References Cited

U.S. PATENT DOCUMENTS

| | | |
|---|---|---|
| 2014/0347430 A1 | 11/2014 | Maeda et al. |
| 2017/0013239 A1 | 1/2017 | Tabata et al. |

FOREIGN PATENT DOCUMENTS

| | | |
|---|---|---|
| JP | 2008-292735 A | 12/2008 |
| JP | 2013-164503 A | 8/2013 |
| JP | 2014-044376 A | 3/2014 |
| JP | 2014-228657 A | 12/2014 |
| JP | 2015-194694 A | 11/2015 |

\* cited by examiner

IMAGE DRAWING APPARATUS, IMAGE DRAWING METHOD, AND NON-TRANSITORY COMPUTER READABLE MEDIUM STORING PROGRAM

CROSS REFERENCE TO RELATED APPLICATION

This application is a continuation application from PCT application No. PCT/JP2015/006275, filed Dec. 16, 2015 and claims the benefit of priority from Japanese patent application No. 2015-017339, filed on Jan. 30, 2015, the disclosure of which is incorporated herein in its entirety by reference.

BACKGROUND

The present invention relates to an image drawing apparatus, an image drawing method, and a non-transitory computer readable medium storing a program. More specifically, the present invention relates to a laser scanning image drawing apparatus, an image drawing method, and a non-transitory computer readable medium storing a program.

A laser scanning image drawing apparatus that reflects a laser light projected from a light source in a scanning mirror and raster-scans a projection surface by a reflected light beam to display an image on the projection surface has been known. In recent years, a Micro Electro Mechanical Systems (MEMS) mirror has been used, for example, as the scanning mirror, whereby the laser scanning image drawing apparatus has been reduced in size and various application products such as a Head-Up Display (HUD) or a Head Mounted Display (HMD) have been developed. In the image display apparatus, Auto Power Control (APC) to make the emission intensity stable may be performed according to a property of the laser diode that the emission intensity is changed due to a temperature variation, aging or the like (see Japanese Unexamined Patent Application Publication No. 2013-164503 as one example).

SUMMARY

The APC control of the image display apparatus is performed, for example, as follows. Each of RGB laser diodes outputs a laser light to an outside of a drawing area (blanking area or the like). The laser light output here generates an APC emission line in the blanking area (FIG. 2). A necessary current is applied to the laser diode to obtain a desired emission intensity (luminance). When the laser is used, however, a correspondence between a current to be applied and luminance may vary depending on the temperature variation, aging or the like. That is, even when the current applied remains the same, the luminance that is actually obtained may differ depending on conditions.

In order to solve the above problem, a sensor measures the actual luminance of the laser light that has been emitted as each emission line. The image processor compares the luminance intended by the laser diode with the actual luminance and determines the current state of the laser diode. The image processor then determines the output of the laser when an image is projected in the drawing area according to the current state of the laser diode. That is, the image processor adjusts the current to be applied to the laser diode that is necessary to obtain a desired luminance.

However, in the aforementioned APC control, a stray light based on the laser light that has been emitted to the blanking area as an APC light may have an influence on a projection image in the drawing area.

In order to solve the above-mentioned problem, this exemplary embodiment provides an image display apparatus including: a light source unit configured to output a laser light; a scanner configured to reflect and scan the laser light; an image processor configured to control the light source unit, output image data that has been input to a drawing area narrower than a scanning area of the scanner, output an emission line to adjust brightness of the laser light to an outside of the drawing area, stop the output of the emission line when a period until the time the output of the emission line becomes stable is passed after the output of the emission line is started and receives an index regarding the brightness of the emission line, and adjust the brightness of the laser light based on the index; and a sensor configured to measure the index regarding the brightness of the emission line to output the index to the image processor, in which the period until the time the output of the emission line is stopped can be varied.

Further, this exemplary embodiment provides an image display method including the steps of: controlling a laser light source unit and a scanner and drawing image data in a drawing area; outputting an emission line to adjust brightness of the laser light to an outside of the drawing area; measuring an index regarding brightness of the emission line; stopping the output of the emission line when a period until the time the output of the emission line becomes stable is passed after the output of the emission line is started; and adjusting the brightness of the laser light based on the index regarding the brightness of the emission line, in which the period until the time the output of the emission line is stopped can be varied.

Furthermore, this exemplary embodiment provides a non-transitory computer readable medium that stores a program for causing a computer to execute the aforementioned image drawing method.

DETAILED DESCRIPTION

Figure 1:
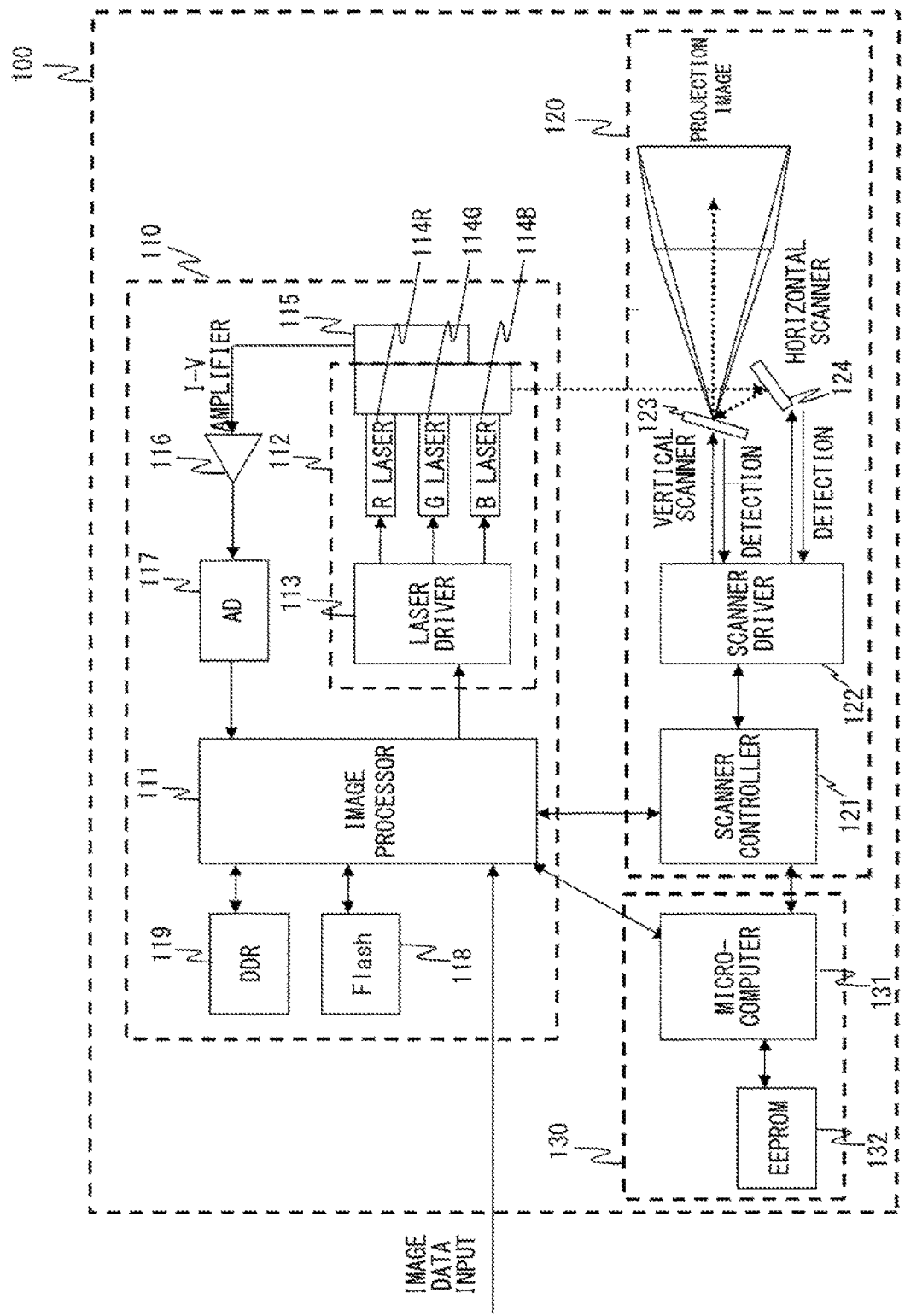
FIG. 1 is a diagram showing a configuration of an image drawing apparatus 100 according to an exemplary embodiment.

In the following description, with reference to the drawings, preferred embodiments will be described. Specific values and the like shown in these embodiments are merely examples to facilitate understanding of the exemplary embodiment and are not intended to limit the exemplary embodiment unless otherwise specified. Throughout the specification and the drawings, the elements having substantially the same function and the configuration will be denoted by the same reference symbols and the overlapping descriptions will be omitted and elements that have no direct relation with the exemplary embodiment will not be shown in the drawings.

First Embodiment

First, with reference to FIG. 1, a configuration of an image drawing apparatus 100 according to a first exemplary embodiment will be described. As shown in FIG. 1, the image drawing apparatus 100 includes a light source unit 110, a scanner 120, and a controller 130. The light source unit 110 and the scanner 120 form a display unit that draws an image based on an image signal that has been input on a projection surface.

The light source unit 110 drives a laser light source according to the image signal that has been input and outputs a laser light to the subsequent scanner 120. The light source unit 110 includes an image processor 111, a laser drive unit 112, a sensor 115, an I-V amplifier 116, an AD converter 117, a volatile memory 119 such as a DDR-SDRAM, and a nonvolatile memory 118 such as a flash memory.

The image processor 111 is typically a microcomputer and executes the following processing.

The image processor 111 receives an original image signal via a video interface or the like. The image processor 111 decodes the original image signal according to the type of the image. When the original image signal is an analog image signal (component video signal), for example, the original image signal is separated into digital image data composed of three-color (RGB) digital color signals and a synchronizing signal including a horizontal synchronizing signal and a vertical synchronizing signal by decode processing.

The image processor 111 temporarily writes the image data that has been decoded into a buffer, then reads out the image data from the buffer for each line of a main scanning line at a timing suitable for the laser scanning image drawing apparatus, and then outputs the data that has been read out to the subsequent stage. That is, the image processor 111 reads out the image data in accordance with a timing signal (dot clock, drawing period indication signal) that has been adjusted based on pivot of the scanner 120 in the horizontal direction that will be described later.

The light source unit 110 includes a laser drive unit 112 to generate the laser light. The laser drive unit 112 includes a red laser diode 114R, a blue laser diode 114B, and a green laser diode 114G as the laser light source to obtain three RGB colors. Further, a laser driver 113 drives each of the laser diodes 114.

The laser driver 113 sequentially receives image data read out by the image processor 111, performs D/A conversion on the image data, and outputs a drive current to emit each of the laser beams corresponding to the three colors (RGB) that compose the image data that has been read out at a desired luminance. The laser diodes 114 each emit light at a three-color (RGB) luminance corresponding to the drive current applied by the laser driver.

Each pixel data that forms the image data includes color information formed of three colors of R (red), G (green), and B (blue) for each pixel. The laser driver 113 applies a current to each of the RGB laser diodes 114 according to luminance information of each color of each pixel. When black is drawn, the laser light is not emitted.

The laser light beams of three colors of RGB output from the laser drive unit 112 are made incident on the subsequent scanner 120 at a predetermined angle as a light flux that is combined in one axis via a dichroic mirror, a condenser lens or the like (not shown). The scanner 120 draws the image on the projection surface by reflecting the incident light by a vertical scanner 123 and a horizontal scanner 124 that pivot in the vertical direction and the horizontal direction and scanning the projection surface by the reflected light.

Further, the image processor 111 performs APC control. According to the property of the laser diode 114, the emission intensity of the laser diode 114 obtained with respect to the current to be applied changes due to a temperature variation, aging or the like. Accordingly, in order to constantly obtain a desired emission intensity, it is required to measure an actual emission intensity and perform control to correct the difference between the accrual emission intensity and the desired emission intensity in real time. Such a control is called an APC control. A specific procedures of the APC control according to related art will be described below.

Figure 2:
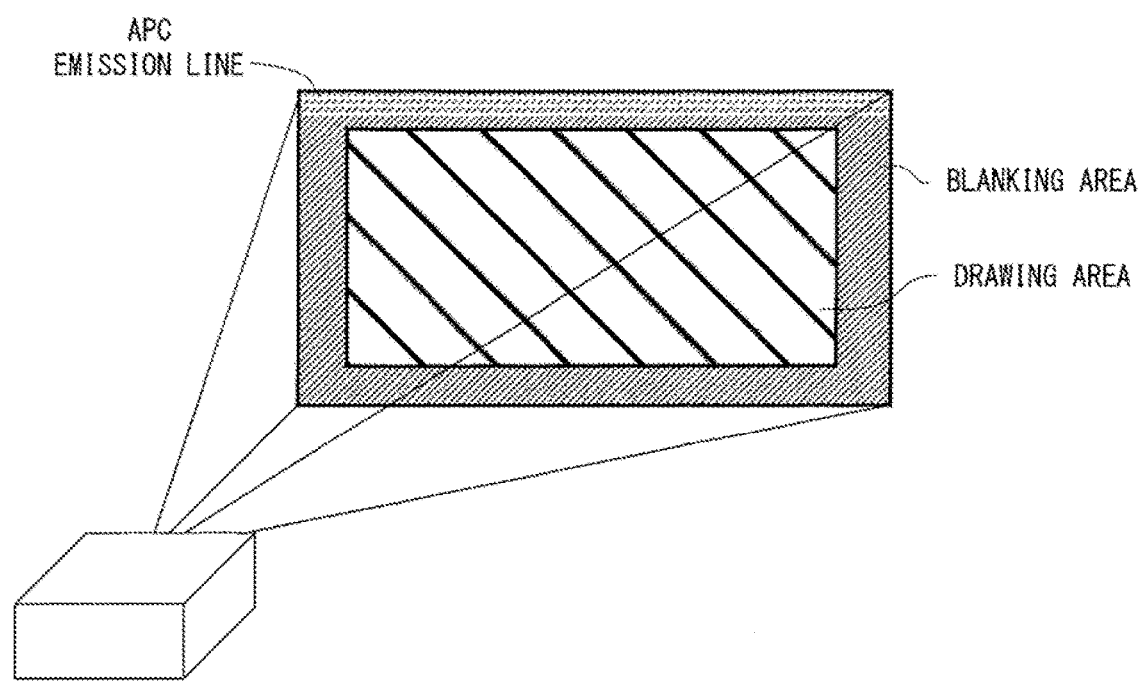
FIG. 2 is a diagram showing a related art.

The image processor 111 drives each of the red laser diode 114R, the green laser diode 114G, and the blue laser diode 114B by the laser driver 113 to output the laser light to a blanking area, which is outside a drawing area. The laser light output to perform the APC control is referred to as an adjustment laser light. FIG. 2 shows an example of the drawing area, the blanking area, and an emission line by the adjustment laser light. The drawing area, which is an area narrower than a scanning area of the scanner 120 that will be described later, is an area in which a display image is drawn by scanning of the laser light. The blanking area is an area in the scanning area of the scanner 120 outside the drawing area. In this example, since the adjustment laser light is output during a period in which the upper left part of the blanking area is scanned, the emission line is drawn in the upper left part of the blanking area. That is, by outputting the laser light during the scanning period in the upper part of the drawing area, the adjustment laser light to perform the APC control is output. The position to which the adjustment laser light is output may be a desired position in the blanking area such as a lower part of the drawing area. In reality, the adjustment laser light is shielded by a structure in the image drawing apparatus 100 so that the adjustment laser light does not come outside the image drawing apparatus 100.

The sensor 115 observes an output value of the adjustment laser light and outputs a measurement signal (current value) in accordance with the emission intensity of the laser light to the I-V amplifier 116. The sensor 115 may be, for example, a photodiode. The I-V amplifier 116 converts the current value of the measurement signal into voltage value and amplifies the measurement signal, and outputs the resulting signal to the AD converter 117. The AD converter 117 converts the measurement signal after the voltage conversion and the amplification into a digital signal of the measurement signal and outputs the digital signal to the image processor 111. The image processor 111 controls the emission intensity of the laser light based on the measurement signal that has been digitally converted.

The image processor 111 performs control to adjust the emission intensity of the laser light to be output to the drawing area in accordance with the measured (actual) emission intensity. That is, the current to be applied is corrected in real time to obtain an expected emission intensity.

Next, a configuration of the scanner 120 will be described. The scanner 120 includes a scanner controller 121, the vertical scanner 123, the horizontal scanner 124, and a scanner driver 122.

The laser light emitted from the light source unit 110 is incident on the vertical scanner 123 and the horizontal scanner 124 of the scanner 120. The vertical scanner 123 and the horizontal scanner 124 draw an image on the projection surface by reflecting the incident laser light at a predetermined timing and angle and scanning the projection surface by the reflected light.

The vertical scanner 123 is a mirror that pivots to scan the image in the vertical direction (sub-scanning direction). The horizontal scanner 124 is a mirror that pivots to scan the image in the horizontal direction (main-scanning direction) and each of the vertical scanner 123 and the horizontal scanner 124 is formed of an MEMS mirror or the like. The vertical scanner 123 and the horizontal scanner 124 are driven by piezoelectric elements or the like. The vertical scanner 123 and the horizontal scanner 124 are not necessarily independent from each other and may be, for example, one mirror that includes two pivot axes that are perpendicular to each other and pivots in two directions to raster scan the image light flux. In the following description, for the sake of convenience of the description, the pivot axis of the mirror corresponding to the scanning of the image in the horizontal direction (main-scanning direction) is denoted by an H axis and the pivot axis of the mirror corresponding to the scanning of the image in the vertical direction (sub-scanning direction) is denoted by a V axis.

The scanner driver 122 applies a current to the piezoelectric elements that drive the vertical scanner 123 and the horizontal scanner 124 at a predetermined timing. Accordingly, the vertical scanner 123 and the horizontal scanner 124 are driven to oscillate at a cycle in accordance with this timing.

The scanner controller 121 controls the scanner driver so that the operation of the scanner suitable for the image to be output from the image processor 111 is performed based on the command from the controller 130.

The pivot of the mirror in the H-axis direction, which is the main-scanning direction, is typically resonant drive. On the other hand, the pivot of the mirror in the V-axis direction, which is the sub-scanning direction, is typically non-resonant drive. The scanner driver 122 adjusts the cycle of the oscillation in the V-axis direction in accordance with the frame rate of the image signal. The scanner driver 122 is able to adjust the oscillation angle, the scanning frequency or the like of the vertical scanner 123 and the horizontal scanner 124 by controlling the drive waveform to be applied to the piezoelectric element based on the control by the scanner controller 121.

The scanner 120 preferably includes a sensor or the like to detect the oscillation angle or the like of each of the vertical scanner 123 and the horizontal scanner 124 and outputs the detection signal to the controller 130. The controller 130 controls the oscillation angle of the scanner, generation of the waveform, the scanning frequency and the like while monitoring the detection signal.

The controller 130 controls the whole operations of the light source unit 110 and the scanner 120. Specifically, the controller 130 includes a microcomputer 131 and a nonvolatile memory 132 such as an EEPROM.

Figure 3:
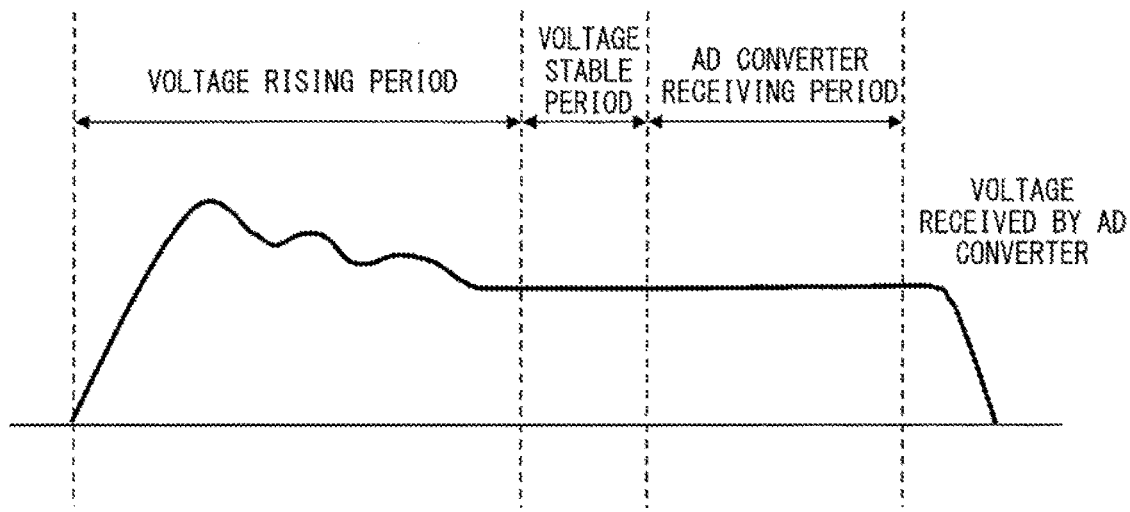
FIG. 3 is a diagram showing an outline of a first exemplary embodiment.

With reference to FIG. 3, the features of the image drawing apparatus 100 according to the first exemplary embodiment will be described.

FIG. 3 shows a change in the voltage values that the AD converter 117 receives from the I-V amplifier 116 in time series. While the voltage values are not fixed and vary for a predetermined period after the start of the input (rising period), the voltage values become substantially constant during and after a voltage stable period. Therefore, the AD converter 117 receives the voltage value at the timing when the voltage stable period is completed. That is, the AD converter 117 converts the voltage value that the AD converter 117 has received into a digital value and outputs the value after the conversion to the image processor 111.

Figure 4:
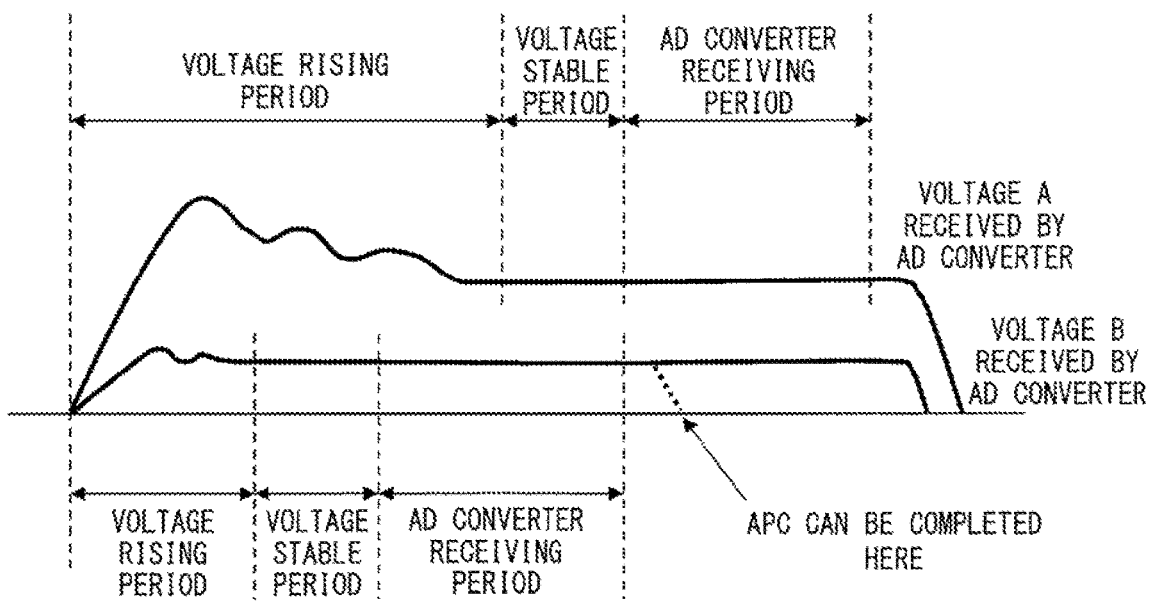
FIG. 4 is a diagram showing the outline of the first exemplary embodiment.

Originally, the behavior of the waveform which is voltage-converted at the time of rising varies depending on the color, the luminance or the like of the laser. However, in the image processing apparatus according to the related art, the timing when the AD converter 117 receives the voltage value, that is, the period from the time the laser light is emitted until the time the waveform which is voltage-converted is read out is fixed. As shown in FIG. 4, for example, both a voltage B received by the AD converter in which the voltage value becomes stable at a relatively early timing and a voltage A received by the AD converter in which the timing until the time the voltage value becomes stable is relatively slow are read out at the same timing. Therefore, the period during which the adjustment laser light is emitted is always constant.

On the other hand, in the image drawing apparatus 100 according to the first embodiment, the timing when the AD converter 117 receives the voltage value, that is, the period from the time the laser light is emitted until the time the waveform which is voltage-converted is read out is changed depending on the color, the luminance and the like of the laser. Regarding the timing when the voltage value is received, the timing in accordance with the luminance, the temperature and the like can be set in advance for each of the laser diodes 114. Preferably, a set value of the timing may be stored in the nonvolatile memory 119 or the nonvolatile memory 132. Then the microcomputer 131 or the image processor 111 reads out the set value from the nonvolatile memory 119 or the nonvolatile memory 132 and instructs the AD converter 117 to receive the voltage value at a timing according to this set value. It is therefore possible to minimize the period during which the adjustment laser light is emitted.

Figure 5:
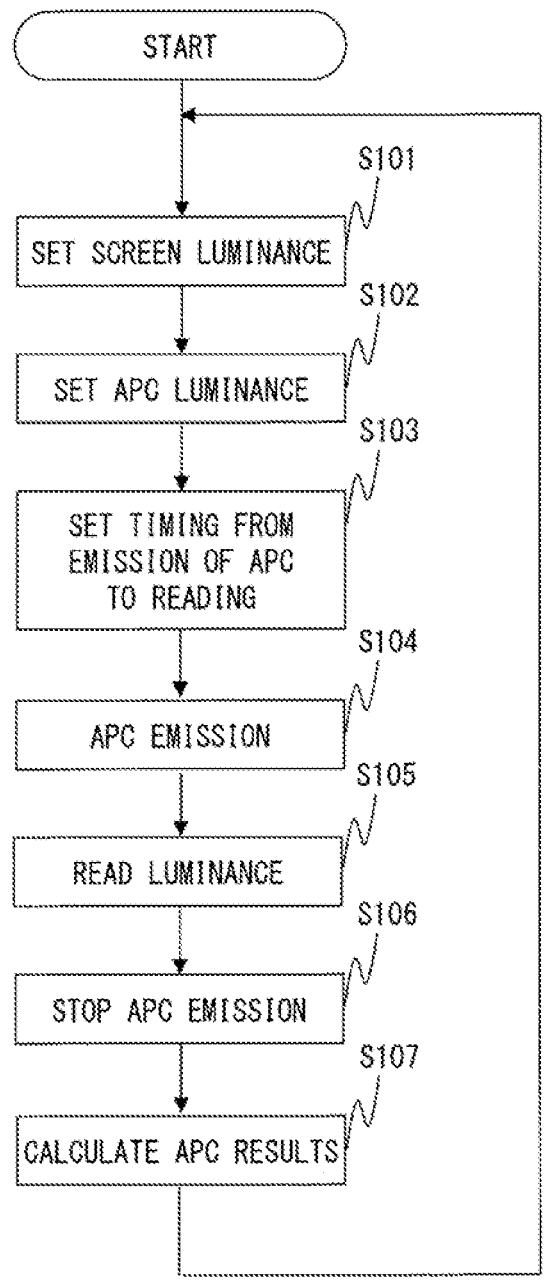
FIG. 5 is a diagram showing an operation of the image drawing apparatus 100 according to the first exemplary embodiment.

With reference next to a flowchart in FIG. 5, the operations of the image drawing apparatus 100 according to the first exemplary embodiment will be described.

S101:

A screen luminance is set in the image processor 111. The screen luminance means a target luminance of an image that is actually projected through the laser drive unit 112 and the scanner 120. That is, the parameter indicating at which luminance the projection image should be eventually drawn is input to the image processor 111.

The screen luminance may be input, for example, from the microcomputer 131, stored in the nonvolatile memory 119 or the like in advance, or directly set in the image processor 111 from outside.

S102:

The image processor 111 sets the luminance of the adjustment laser light in accordance with the screen luminance set in S101. That is, the image processor 111 determines, in order to output the adjustment laser light for the APC emission at the same luminance as the screen luminance set in S101, the current to be applied to the laser diode 114 corresponding to this luminance.

The correspondence between the luminance and the current to be applied is stored, for example, in the nonvolatile memory 132, the nonvolatile memory 119, the volatile memory 118 or the like in advance in the form of a table or the like.

S103:

The image processor 111 sets the period (timing) from emission to reading in the APC control. As described above, the behavior at the rising point of the waveform which is voltage-converted varies depending on the color, the luminance, the temperature and the like of the laser. That is, the period from the time the laser light is emitted until the time the waveform which is voltage-converted becomes stable varies depending on the type and the emission condition of the laser diode 114. Accordingly, in this embodiment, the period until the time the voltage value becomes stable is defined in advance according to the color, the luminance, the temperature and the like of the laser diode 114.

Specifically, for each of the red laser diode 114R, the green laser diode 114G, and the blue laser diode 114B, the period (timing) from emission to reading is defined so as to correspond to the combination of various emission conditions, such as the luminance, the temperature and the like. This definition is stored in the nonvolatile memory 132, the nonvolatile memory 119, the volatile memory 118 or the like in advance in the form of, for example, a table.

The image processor 111 refers to the aforementioned table to acquire, for each of the red laser diode 114R, the green laser diode 114G, and the blue laser diode 114B, the period (timing) from emission to reading corresponding to the combination of the luminance set in S102, the current temperature and the like.

S104:

The image processor 111 starts emission of the adjustment laser light. Specifically, the image processor 111 controls the laser driver 113 to cause the laser diode 114 to emit the adjustment laser light at the luminance and for the period set in S102. The laser driver 113 drives each of the red laser diode 114R, the green laser diode 114G, and the blue laser diode 114B using the drive current determined in S102. The period during which the image processor 111 executes the APC processing corresponds to the period during which the vertical scanner 123 and the horizontal scanner 124 are scanning the blanking area.

S105:

The image processor 111 starts measuring the luminance of the adjustment laser light and reading out the measurement value at the timing set in S103. Specifically, the image processor 111 refers to the definition stored in advance in the nonvolatile memory 132, the nonvolatile memory 119, the volatile memory 118 or the like to acquire, for each of the red laser diode 114R, the green laser diode 114G, and the blue laser diode 114B, the period (timing) from emission to reading corresponding to the combination of the emission conditions such as the luminance that has been set in S102, the current temperature and the like. Next, the image processor 111 controls the sensor 115 to cause the sensor 115 to measure the luminance of the adjustment laser light output in S104. Then the I-V amplifier 116 converts information on the luminance into a voltage and the AD converter 117 receives this voltage, and outputs the voltage value to the image processor 111.

S106:

The image processor 111 stops, when the reading in S105 has been completed or when the period that has been set in advance for the reading has passed, the emission of the adjustment laser light. Specifically, the image processor 111 controls the laser driver 113 to stop the emission of the adjustment laser light and the laser driver 113 stops the emission of the laser diode 114.

S107:

The image processor 111 compares the luminance corresponding to the voltage value that has been input, that is, the luminance that has been actually measured, with the luminance that has been set in S102. When there is a certain level of difference or more between the luminance that has been set and the actual luminance, the image processor 111 corrects the correspondence between the luminance shown in S102 and the current to be applied. When the actual luminance is lower than the luminance that has been set, for example, the image processor 111 increases the current to be applied to obtain the desired luminance. On the other hand, when the actual luminance is higher than the luminance that has been set, the image processor 111 decreases the current to be applied to obtain the desired luminance. In this way, the adjustment is performed in such a way that the difference between the luminance that has been set and the actual luminance becomes smaller than the current difference.

After the aforementioned processes, the image processor 111 is able to repeatedly execute the aforementioned steps S101 to S107. The difference between the luminance that has been set and the actual luminance is thus corrected. Further, even when the emission condition (e.g., temperature) of the laser diode 114 varies with time, the APC control can be executed following this variation.

Figure 6:
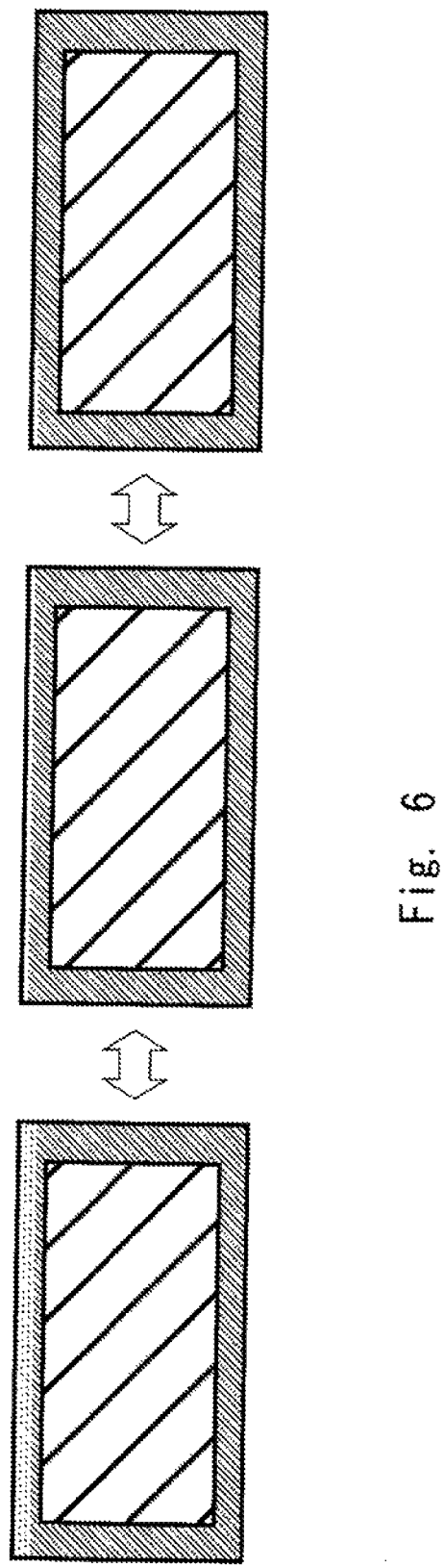
FIG. 6 is a diagram showing effects of the first exemplary embodiment.

In this embodiment, the image processor 111 determines the optimal period (timing) from the start of the emission of the adjustment laser light to the stop of the emission thereof according to the emission conditions such as the color, the temperature or the like of the laser diode 114. The image drawing apparatus 100 then performs emission of the adjustment laser light only for a minimum necessary period. Accordingly, as shown in FIG. 6, the period during which the adjustment laser light is emitted in the image drawing apparatus 100 is varied. FIG. 6 is a diagram showing a change in the period during which the adjustment laser light is emitted as an APC emission line. Since the period during which the adjustment laser light is emitted is changed, the length and the number of APC emission lines corresponding to the period during which the adjustment laser light is emitted can be varied. Accordingly, the APC emission line corresponding to the shortest period during which the adjustment laser light is emitted in accordance with the conditions when the APC processing is executed is drawn. Accordingly, the influence of the stray light on the drawing screen due to the emission of the adjustment laser light can be minimized.

Second Embodiment

In the first embodiment, the method of defining the period (timing) from the start of the emission of the adjustment laser light to the stop of the emission thereof has been proposed. In the second embodiment, a method of determining the above timing by calculation without determining this timing in advance is proposed.

Since the configuration of the image drawing apparatus 100 according to the second exemplary embodiment is similar to that of the first embodiment, the description thereof will be omitted.

Figure 8:
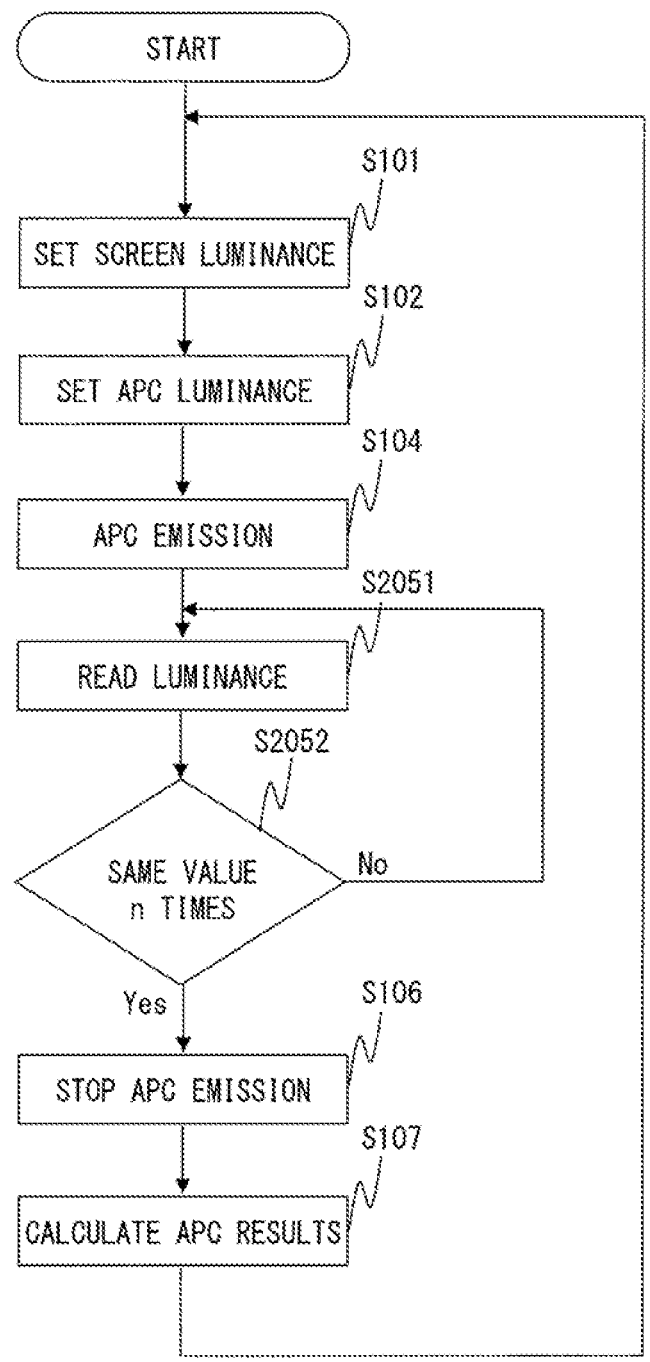
FIG. 8 is a diagram showing an operation of an image drawing apparatus 100 according to the second exemplary embodiment.

With reference to a flowchart shown in FIG. 8, the operation of the image drawing apparatus 100 according to the second exemplary embodiment will be described. In this description, the operation specific for the second exemplary embodiment will be mainly described and the detailed description of the operation similar to that in the first exemplary embodiment will be omitted.

S101:

The screen luminance is set in the image processor 111.

S102:

The image processor 111 sets the luminance of the adjustment laser light in accordance with the screen luminance set in S101.

S104:

The image processor 111 starts emission of the adjustment laser light. The laser driver 113 drives each of the red laser diode 114R, the green laser diode 114G, and the blue laser diode 114B at a drive current corresponding to the luminance of the adjustment laser light that has been determined in S102. The APC processing is thereby started.

Figure 7:
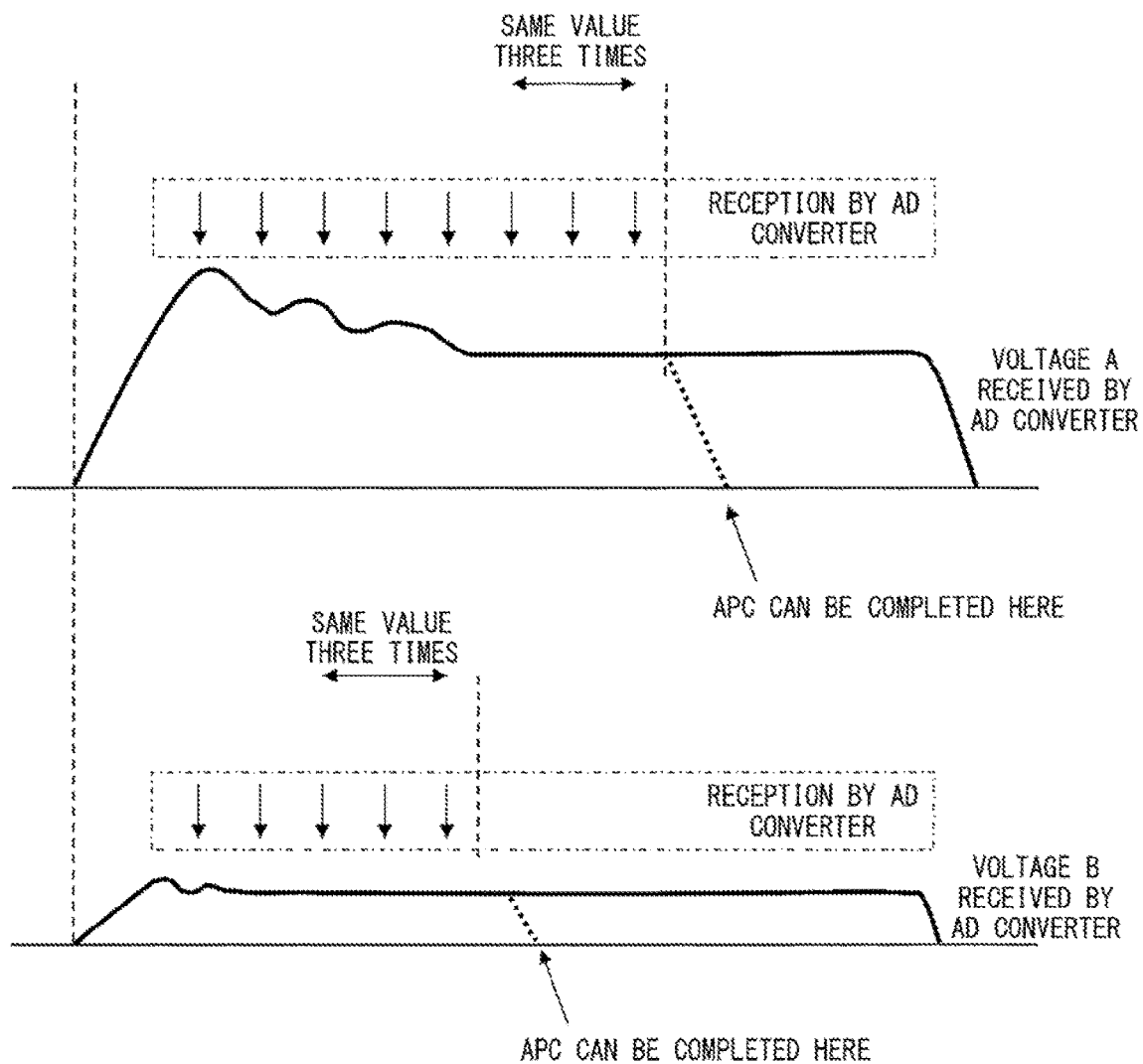
FIG. 7 is a diagram showing an outline of a second exemplary embodiment.

S2051:

The image processor 111 starts measuring the luminance of the adjustment laser light and reading out the measurement value. After that, the measurement and the reading of the measurement value are repeated at predetermined time intervals. The timing of the start of the above measuring and reading out is preferably earlier than the timing when the voltage value becomes stable (FIG. 7).

S2052:

The image processor 111 determines whether the voltage values input from the AD converter 117 are within a predetermined range (that is, the voltage values are almost the same value) a predetermined number of successive times. In the example shown in FIG. 7, for example, when substantially the same voltage value is detected for three consecutive times, the result of the determination becomes YES. Otherwise, the result of the determination becomes NO. When the result of the determination is YES, the process moves to S106.

S106:

The image processor 111 stops emission of the adjustment laser light.

S107:

The image processor 111 compares the luminance that has been actually measured with the luminance that has been set in S102 and corrects, when there is a certain level of difference or more between them, the correspondence between the luminance shown in S102 and the current to be applied.

After the above processes, the image processor 111 is able to repeatedly execute the aforementioned steps.

According to this embodiment, the image processor 111 measures and reads the luminance of the adjustment laser light at predetermined time intervals after the emission of the adjustment laser light is started and when the values that have been read are within a predetermined range for n times, the emission of the adjustment laser light is completed. It is therefore possible to minimize the period during which the adjustment laser light is emitted according to the state of the laser diode 114 without storing the period (timing) from the start of the emission of the adjustment laser light to the reading of the luminance of the same in advance.

Note that the exemplary embodiment is not limited to the aforementioned embodiments and may be changed as appropriate without departing from the spirit of the exemplary embodiment. For example, while the example in which the exemplary embodiment has been applied mainly to the MEMS device has been described in the aforementioned embodiments, the exemplary embodiment is not limited thereto.

Furthermore, while the sensor 115 measures the luminance in the aforementioned embodiments as described above, the exemplary embodiment is not limited to this example and the sensor 115 may measure another index indicating the brightness of the laser light such as, for example, a light flux, a light amount, luminosity, or illuminance. In this case, the I-V amplifier 116 and the AD converter 117 convert one of these indices into a voltage value.

Further, while the exemplary embodiment has been described as a hardware configuration in the aforementioned embodiments, the exemplary embodiment is not limited thereto and may achieve desired processing by causing a central processing unit (CPU) to execute a computer program. In this case, the program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

The exemplary embodiment is applicable to an image drawing apparatus, an image drawing method, and a non-transitory computer readable medium storing a program, and more specifically, the exemplary embodiment is applicable to and industrially applicable to a laser scanning image drawing apparatus, an image drawing method, and a non-transitory computer readable medium that stores a program.

It is possible to provide an image drawing apparatus, an image drawing method, and a non-transitory computer readable medium that stores a program capable of suppressing an influence of a laser light that has been emitted as an APC light on a drawing screen.

What is claimed is:

1. An image display apparatus comprising:
   a light source unit configured to output a laser light;
   a scanner configured to reflect and scan the laser light;
   a sensor configured to measure an index regarding brightness of the laser light; and
   an image processor configured to perform the following processing of:
   controlling the light source unit;
   outputting the laser light to a drawing area narrower than a scanning area of the scanner so that an image based on image data that has been input is drawn;
   outputting an adjustment laser light to adjust the brightness of the laser light to an outside of the drawing area;
   setting a period for stopping the output of the adjustment laser light, the period comprising an amount of time from starting the output of the adjustment laser light until a time when the output of the adjustment laser light becomes stable has passed; and
   adjusting the brightness of the laser light based on the index regarding the brightness of the adjustment laser light, wherein
   the period for stopping the output of the adjustment laser light can be varied, and
   the image processor acquires the index regarding the brightness of the adjustment laser light a number of times after the output of the laser light becomes stable, and stops outputting the adjustment laser light before the period that has been set in advance for stopping the output of the adjustment laser light has passed when the index falls within a predetermined range for a predetermined number of successive times.

2. The image display apparatus according to claim 1, wherein the image processor varies the period during which the adjustment laser light is being output according to at least one of a type of the laser light and an emission condition.

3. An image display method comprising the steps of:
controlling a laser light source unit and a scanner and drawing an image based on image data in a drawing area;
outputting an adjustment laser light to adjust brightness of the laser light to an outside of the drawing area;
measuring an index regarding brightness of the adjustment laser light;
setting a period for stopping the output of the adjustment laser light, the period comprising an amount of time from starting the output of the adjustment laser light until a time when the output of the adjustment laser light becomes stable has passed; and
adjusting the brightness of the laser light based on the index regarding the brightness of the adjustment laser light, wherein
the period for stopping the output of the adjustment laser light can be varied, and
the method further comprises the step of acquiring the index regarding the brightness of the adjustment laser light a number of times after the output of the laser light becomes stable, and stopping the output of the adjustment laser light before the period that has been set in advance for outputting the adjustment laser light has passed when the index falls within a predetermined range for a predetermined number of successive times.

4. A non-transitory computer readable medium storing a program for causing a computer included in an image drawing apparatus to execute the method according to claim 3.

* * * * *